United States Patent
Alam

(10) Patent No.: US 11,385,986 B2
(45) Date of Patent: Jul. 12, 2022

(54) IDENTIFICATION OF KEY ERRORS IN A SYSTEM HAVING A LARGE NUMBER OF ERROR EVENTS

(71) Applicant: Siemens Industry Software Inc., Plano, TX (US)

(72) Inventor: Michael Alam, Ottawa (CA)

(73) Assignee: Siemens Industry Software Inc., Plano, TX (US)

( * ) Notice: Subject to any disclaimer, the term of this patent is extended or adjusted under 35 U.S.C. 154(b) by 429 days.

(21) Appl. No.: 16/088,990

(22) PCT Filed: Mar. 31, 2017

(86) PCT No.: PCT/US2017/025504
§ 371 (c)(1),
(2) Date: Sep. 27, 2018

(87) PCT Pub. No.: WO2017/173344
PCT Pub. Date: Oct. 5, 2017

(65) Prior Publication Data
US 2020/0327028 A1 Oct. 15, 2020

Related U.S. Application Data

(60) Provisional application No. 62/315,745, filed on Mar. 31, 2016.

(51) Int. Cl.
G06F 11/30 (2006.01)
G06F 30/367 (2020.01)
G06F 30/398 (2020.01)
G06F 11/14 (2006.01)
G06F 11/32 (2006.01)
(Continued)

(52) U.S. Cl.
CPC ...... *G06F 11/3072* (2013.01); *G06F 11/1471* (2013.01); *G06F 11/321* (2013.01); *G06F 11/3692* (2013.01); *G06F 30/33* (2020.01); *G06F 30/367* (2020.01); *G06F 30/398* (2020.01)

(58) Field of Classification Search
CPC .................................................. G06F 11/3072
USPC ........................................................ 716/106
See application file for complete search history.

(56) References Cited

U.S. PATENT DOCUMENTS 6,374,395 B1 * 4/2002 Wang ...................... G06F 30/39
716/112
7,461,360 B1 * 12/2008 Ho ........................ G06F 30/398
716/109
(Continued)

FOREIGN PATENT DOCUMENTS

WO 2015125041 A1 8/2015

OTHER PUBLICATIONS

PCT International Search Report and Written Opinion dated Jul. 24, 2017 corresponding to PCT Application No. PCT/US2017/025504 filed Mar. 31, 2017.

*Primary Examiner* — Suchin Parihar

(57) ABSTRACT

A report of results of validating a circuit can simplify a large number of error events, that can be generated when designing electrical circuits using computer aided design tools, by first filtering the large number of error events according to a user defined filter criteria. The filter results are processed by one or more report rules. Each of the report rules may generate one or more report results based on, at least, the filtered error events.

21 Claims, 4 Drawing Sheets

(51) Int. Cl.
  *G06F 11/36*    (2006.01)
  *G06F 30/33*    (2020.01)

(56)     References Cited

U.S. PATENT DOCUMENTS

| | | | |
|---|---|---|---|
| 9,245,088 B1* | 1/2016 | O'Riordan | G06F 30/398 |
| 2003/0086536 A1* | 5/2003 | Salzberg | H04M 3/22 |
| | | | 379/15.02 |
| 2006/0184529 A1 | 8/2006 | Berg et al. | |
| 2013/0024830 A1* | 1/2013 | Tang | G06F 30/33 |
| | | | 716/112 |
| 2013/0125072 A1* | 5/2013 | Newcomb | G06F 30/30 |
| | | | 716/107 |
| 2013/0305194 A1* | 11/2013 | Wang | G06F 30/398 |
| | | | 716/52 |
| 2014/0258951 A1* | 9/2014 | Danti | G06F 30/398 |
| | | | 716/112 |
| 2014/0258954 A1* | 9/2014 | De | G06F 30/3323 |
| | | | 716/113 |
| 2015/0121325 A1* | 4/2015 | Hours | G06F 30/30 |
| | | | 716/107 |
| 2015/0131894 A1* | 5/2015 | Narwade | G06F 30/3323 |
| | | | 382/147 |
| 2018/0096093 A1* | 4/2018 | Graur | G06F 30/398 |

* cited by examiner

IDENTIFICATION OF KEY ERRORS IN A SYSTEM HAVING A LARGE NUMBER OF ERROR EVENTS

RELATED APPLICATIONS

This application claims the benefit of priority to U.S. Provisional Application 62/315,745 file Mar. 31, 2016.

TECHNICAL FIELD

The current disclosure relates to systems and methods for validating circuits, and in particular to systems and methods for validating circuits having a large number of error events.

BACKGROUND

A circuit is an electrical network of components. A circuit may include complex digital circuits comprising tens, hundreds, thousands or more of interconnected components. The components of circuits may comprise a single discrete component such as a resistor, capacitor, inductor, diode, transistor etc. The components may also include other circuits providing more complex components such as an operational amplifier, a voltage regulator, a shift register, an arithmetic logic unit, a microcontroller, a microprocessor, etc. Complex functionality can be provided by connecting a plurality of components together in various manners.

The specific connections of components for a circuit may be defined in numerous fashions. One such definition is called a netlist which specifies a plurality of nets, each of which indicates components, or more particularly ports, or pins, of components, that are connected together. Each component specified in a net may be identified by a reference, and the specific component associated with the reference can be specified separately, typically in a Bill of Materials (BOM).

Complex electrical circuits are designed using various computer programs that allow the complexity of components to be abstracted from the view of the designer. While such design tools enable the design of complex electrical circuits and simplify the process, the design tools may also make debugging the large complex circuits difficult as the particular connections between various interacting components, as well as the particular requirements of components, may also be abstracted and/or obscured from the designer's view.

A circuit design may be tested within computer aided design tools in order to identify potential issues with the circuit's design prior to manufacturing the circuit. Identifying potential issues as early as possible in a circuits design is desirable as it may be easier, and/or less costly to correct possible issues earlier in the design process. Complex circuits designed using software tools may generate large numbers of errors, which may make identifying relevant or important errors from among all of the errors difficult or time consuming.

SUMMARY

In accordance with the present disclosure there is provided a system for generating an error report comprising: a memory unit for storing instructions; a processing unit for executing instructions, the instructions when executed configuring the system to provide: a user defined filter component for filtering a plurality of error events associated with validating a circuit definition into a plurality of relevant error events; and a report rule processor for retrieving and processing one or more report rules, the one or more report rules processing one or more of the plurality of relevant error events in order to generate a report message.

In accordance with the present disclosure there is provided a system for generating an error report comprising: a memory for storing instructions; a processing device for executing instructions, the instructions when executed configuring the system to provide: a user defined filter component configured for: receiving a user defined filtering criteria; and filtering a plurality of error events generated from validating the test circuit and stored in an error event database into a plurality of relevant error events according to the received user defined filtering criteria; and a report rule processor component for: retrieving one or more report rules selected for the error report; processing the one or more relevant error events according to the retrieved one or more report rules each of the processed report rules generating one or more report messages; and generating the error report using the one or more report messages generated by processing the one or more report rules.

In a further embodiment, the system further comprises a display, and the instructions when executed further configure the report rule processor component to present the generated error report to a user on the display.

In a further embodiment of the system, each of the error events comprises one or more of: information describing the error associated with the error event; a test identifier of a test that generated the error event; a version number of the circuit the error event was generated for; a revision number of the circuit the error event was generated for; a date the test that generated the error event was run; and a time the test that generated the error event was run.

In a further embodiment of the system, the user defined filtering criteria filters the error events based on one or more of: the test identifier associated with the error event; the version number associated with the error event; the revision number associated with the error event; the date associated with the error event; the time associated with the error event; a severity associated with the error event; a location within the circuit of the error associated with the error event; and additional components connected to a portion of the circuit associated with the error event.

In a further embodiment of the system, the user defined filtering criteria provides a coarse grain filtering of error events.

In a further embodiment of the system, the one or more report rules selected from the error report are retrieved from a plurality of pre-existing report rules.

In a further embodiment of the system, the one or more report rules are selected by one or more of: the user; and a user selected report template.

In a further embodiment of the system, each of the one or more report rules specify the processing required to generate a particular report message.

In a further embodiment of the system, at least one of the one or more report rules generates the one or more report messages based on processing of at least one of the relevant error reports and one or more of: error events stored in the error event database; one or more report messages generated by report rules; a user's previous generation of reports.

In a further embodiment of the system, at least one of the one or more report rules adds one or more additional report rules for processing or removes one or more report rules from processing.

In accordance with the present disclosure there is further provided a method of generating an error report for validation of a test circuit, the method comprising: receiving a user defined filtering criteria; filtering a plurality of error events generated from validating the test circuit and stored in an error event database into a plurality of relevant error events according to the received user defined filtering criteria; retrieving one or more report rules selected for the error report; processing the one or more relevant error events according to the retrieved one or more report rules each of the processed report rules generating one or more report messages; and generating the error report using the one or more report messages generated by processing the one or more report rules.

In a further embodiment, the method further comprises displaying the generated error report to a user on a display.

In a further embodiment of the method, each of the error events comprises one or more of: information describing the error associated with the error event; a test identifier of a test that generated the error event; a version number of the circuit the error event was generated for; a revision number of the circuit the error event was generated for; a date the test that generated the error event was run; and a time the test that generated the error event was run.

In a further embodiment of the method, the user defined filtering criteria filters the error events based on one or more of: the test identifier associated with the error event; the version number associated with the error event; the revision number associated with the error event; the date associated with the error event; the time associated with the error event; a severity associated with the error event; a location within the circuit of the error associated with the error event; and additional components connected to a portion of the circuit associated with the error event.

In a further embodiment of the method, the user defined filtering criteria provides a coarse grain filtering of error events.

In a further embodiment of the method, the one or more report rules selected from the error report are retrieved from a plurality of pre-existing report rules.

In a further embodiment of the method, the one or more report rules are selected by one or more of: the user; and a user selected report template.

In a further embodiment of the method, each of the one or more report rules specify the processing required to generate a particular report message.

In a further embodiment of the method, at least one of the one or more report rules generates the one or more report messages based on processing of at least one of the relevant error reports and one or more of: error events stored in the error event database; one or more report messages generated by report rules; a user's previous generation of reports.

In a further embodiment of the method, at least one of the one or more report rules adds one or more additional report rules for processing or removes one or more report rules from processing.

In accordance with the present disclosure there is provided a non-transitory computer-readable medium storing a computer program product for use in generating an error report for validation of a test circuit, the computer program product comprising instructions, which when executed by a processor configure a computing system to provide: a user defined filter component configured for: receiving a user defined filtering criteria; and filtering a plurality of error events generated from validating the test circuit and stored in an error event database into a plurality of relevant error events according to the received user defined filtering criteria; and a report rule processor component for: retrieving one or more report rules selected for the error report; processing the one or more relevant error events according to the retrieved one or more report rules each of the processed report rules generating one or more report messages; and generating the error report using the one or more report messages generated by processing the one or more report rules.

BRIEF DESCRIPTION OF THE DRAWINGS

Embodiments are described herein with references to the appended drawings, in which.

DETAILED DESCRIPTION

Current circuit design comprises connecting a plurality of components together. The circuit components may be active components or passive components. Each active component used in electronic designs has several electrical parameters which must be observed to ensure that safety and proper operation can be achieved. Failure to take these parameters into consideration can cause both hard and/or intermittent failures which can be very difficult to diagnose. In a simple circuit involving few components, it may be a simple process to debug as there are very few connections to analyze. However circuit designs may be large and extremely complex with thousands of components and thousands of interconnections, each possibly having several pins connected to it. As a simple example, a power supply component may output 1.0 Volts. If a component connected to the power supply requires 3.0 Volts to operate correctly, the circuit will not function. As the number of components increases, the number of tests that may be applied to a circuit, as well as the likelihood of a test generating an error, increases. While the individual error events generated by individual tests may provide meaningful information to a circuit designer or tester, it may be beneficial to further process the test results and take all error events into account to generate meaningful test reports. The processing of the error events may allow similar errors to be combined together, other issues to be identified, possible corrections identified, and other information reported.

Figure 1:
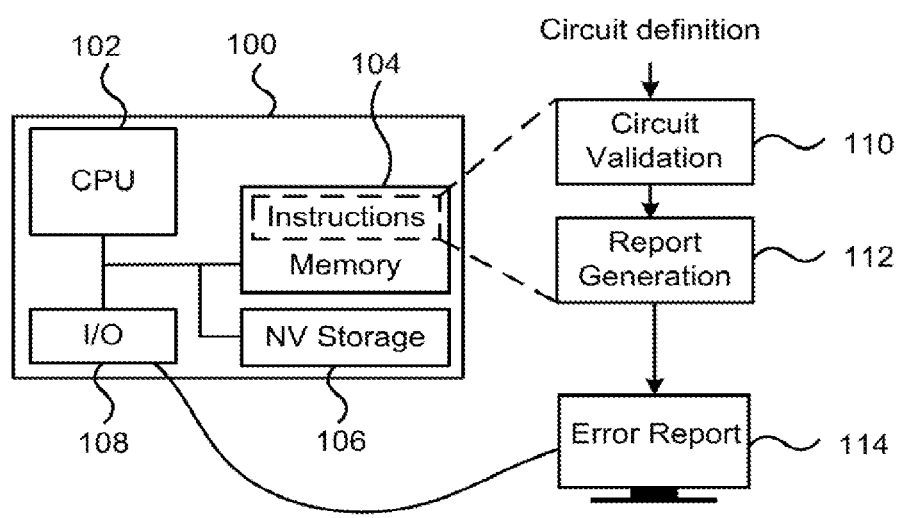
FIG. 1 depicts a system for validating a circuit and generating a result report.

FIG. 1 depicts a system for validating a circuit and generating a result report. The system 100 comprises a processing device 102, which may be provided by a central processing unit (CPU), controller or other devices that execute instructions, and memory 104 connected to the processing device 102. The memory 104 may comprise random access memory (RAM) or other types of memory and may be provided separately from the processing device 102, as part of the processing device 102, or a combination thereof. The system 100 may further comprise a non-volatile storage device 106 for providing storage when the system 100 is powered off. The system 100 may further comprise an input/output (I/O) interface 108 for connecting other devices or components to the processor 102. For example, a display 114 and keyboard (not shown) may be connected to the system 100. Although described as a single physical device, the system may be provided by a plurality of interconnected components. For example, the system may be a distributed computer device.

The memory 104 stores instructions, that when executed by the processing device 102 configure the system 100 to provide circuit validation functionality 110 and report generation functionality 112 as described further herein. The circuit validation functionality 110 receives a definition of a circuit board to be validated and processes the circuit definition in order to identify problems, or potential problems in the circuit definition. The circuit validation functionality 110 may then provide the validation results comprising a plurality of error events indicative of problems or potential problems in the circuit. The plurality of error events may be stored and processed by the report generation functionality 112 in order to generate a report for presentation to a user, for example on the display 114. The generated report may be used to improve the design of the circuit board.

Figure 2:
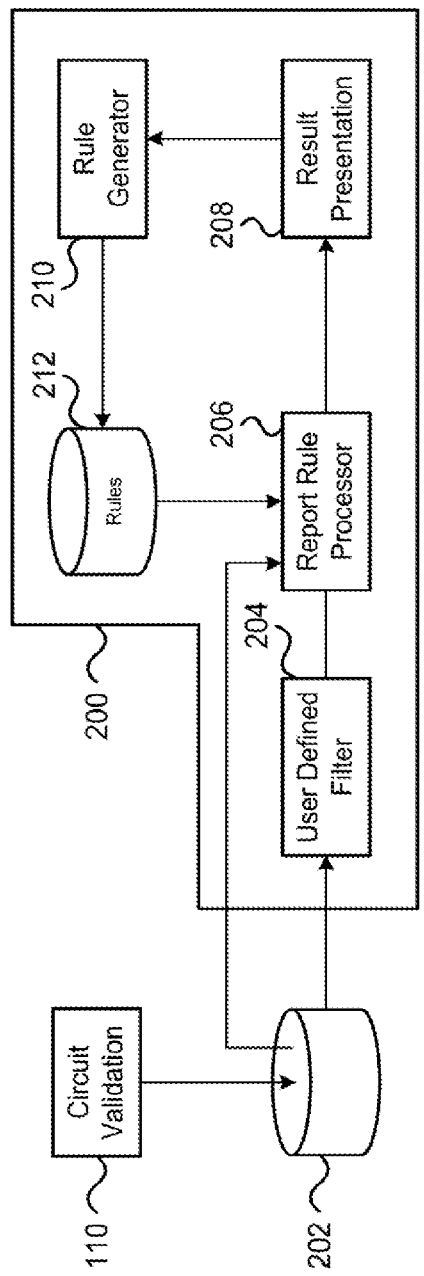
FIG. 2 depicts components of functionality for generating a result report.

FIG. 2 depicts components of functionality for generating a result report. The components of the report generation functionality 200 depicted in FIG. 2 may be used in, for example, the report generation functionality 112 described above with reference to FIG. 1. As depicted in FIG. 2 the process for the report generation is broadly: filtering the initial error events according to a user defined filter requirement, processing one or more report rules against the filtered error events and presenting the results to the user.

As depicted in FIG. 2, circuit validation functionality 110 may validate circuit designs. The circuit validation functionality 110 generates a plurality of error events for a circuit that each provide an indication of a failed test that was applied. Each error event may be stored in a database 202 or similar structure. Each error event may be stored in association with various information such as the test the error event is a result of, information associated with the circuit, such as version and revision numbers, a date a time the test was run, etc. As depicted in FIG. 2 the circuit validation functionality 110 may be provided separately from the report generation functionality 200. Although depicted as being provided by separate functionality, it is possible for the circuit validation and report generation functionality to be combined together.

The report generation functionality 200 comprises user defined filtering functionality 204. The user defined filtering functionality 204 retrieves or receives a plurality of error events stored in the error event database 202. The error events retrieved from the database 202 may be associated with a particular circuit being validated, or a portion of the circuit being validated. The user defined filtering function filters the error event lists according to a user defined filtering requirement. The user defined filtering functionality 204 provides a relatively coarse grain of filtering for the error events. For example, the filtering may result in only those error events associated with a particular version of the circuit being tested remaining. Other filtering may be based on a test date, types of the test associated with errors, severity of the error events, source of the error events, location of the error within a circuit, other circuits and/or components that are connected to the error, as well as other characteristics. Regardless of the particular filtering criteria applied to the error events, a subset of the error events that match the filtering criteria is provided to a report rule processor functionality 206. Although described as providing error events that match the filtering criteria, it is possible to instead provide the error events that do not match the filtering criteria.

The report rules processor functionality 206 may retrieve one or more report rules from a rules database 212. The report rules retrieved may be grouped together according to one or more reports to be generated, for example, if a user is currently designing a power delivery portion of the circuit, report rules previously associated with power delivery can be selected. The rules to be retrieved may be based on other characteristics, such as the filtering criteria, the number of error events provided to the report rule processor functionality 206, or the report rules may be selected or specified by the user. Each of the selected or specified report rules are processed by report rule processor functionality 206. Each of the report rules specify how to generate report results. The report rules may generate report results based on processing of the filtered error events as well as other possible information. For example, a report rule may generate a report result based by combining a plurality of the error events that are associated with a common problem in the circuit into a single report result. In addition to the filtered error events, the report rules may also use error events that were previously filtered out. Additionally, or alternatively, the report rules may use report results generated by other report rules or external information. Additionally, or alternatively, the report rules may use report results based on the behaviour of the user using this system. For example, if a user suppressed certain errors in the past, the report rules will automatically suppress the same or similar errors. Additionally, or alternatively, the report rules may automatically add or remove certain rules based on the system being tested. For example, a rule can automatically identify a medical circuit, or a telecom circuit, or another type of circuits based on the components comprising that circuit, and automatically determine which rules should be applied, and which rules should be ignored. Regardless of how the report results are generated from the processed report rules, they are provided to result presentation functionality 208. The result presentation functionality 208 presents the report results to the user. The result presentation functionality 208 may provide user interaction with the report results. For example, a report result may be expended or selected to provide an indication of the error events, and report rules that generated the report result, or other types of interactions. In addition to displaying the report results, the result presentation functionality 208 may provide user interactions to rule generation functionality 210. The rule generation functionality 210 may generate one or more report rules that can be saved in the rule database 212. In addition to the generated rules, new rules may be stored in the rules database 212 from one or more external sources.

Figure 3:
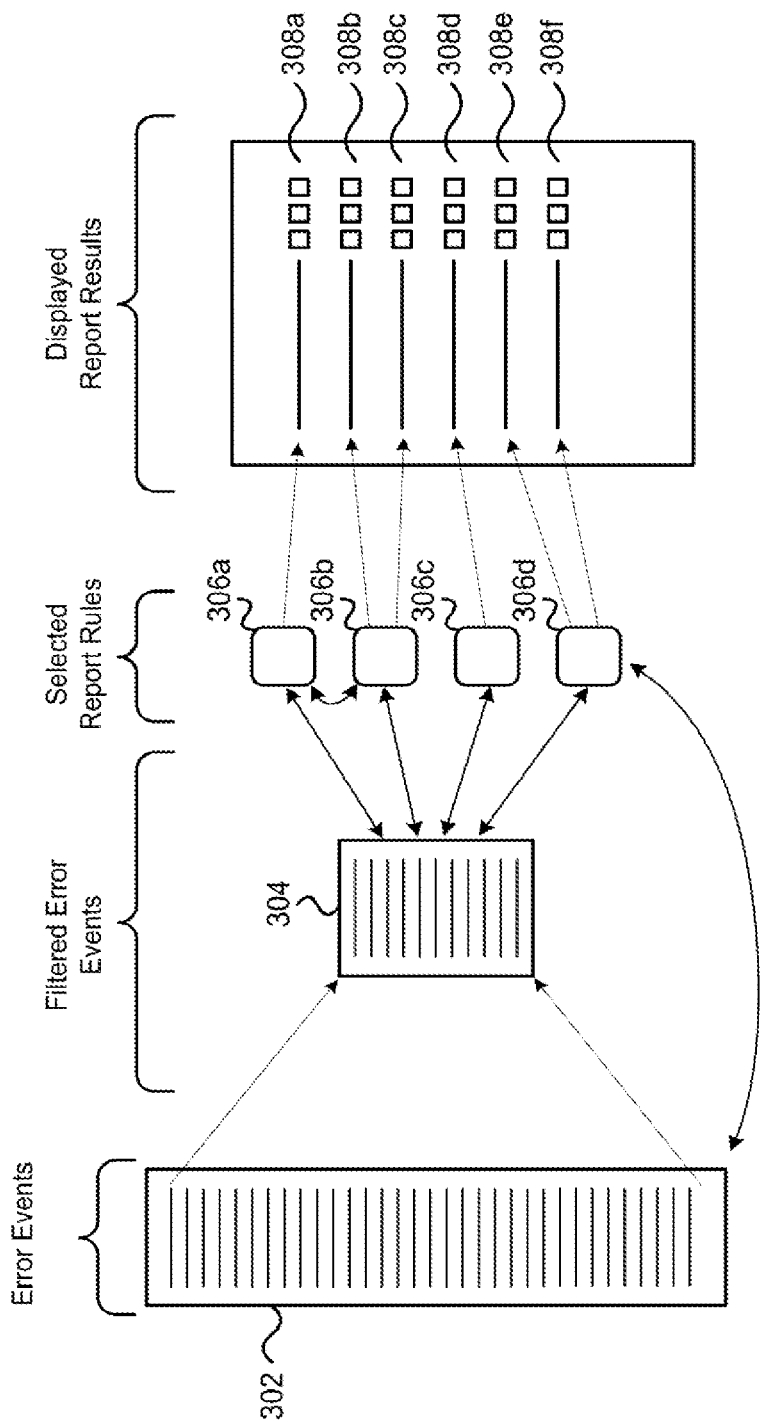
FIG. 3 depicts a process of generating a result report.

FIG. 3 depicts a process of generating a result report. As depicted in FIG. 3, a plurality of error events 302 are retrieved, for example from the database 202 described above with reference to FIG. 2. The plurality of error events 302 are filtered according to some user defined criteria to provide a filtered subset of the error events 304. The filtering of the error events 302 may be done, for example, by the user defined filtering functionality 204. The filtered error events 304 are processed by one or more selected report rules 306a, 306b, 306c, 306d (referred to collectively as report rules 306). Each of the report rules 306 process one or more of the filtered error events in order to generate one or more report results 308a, 308b, 308c, 308d, 308e, 308f (referred to collectively as report results 308). One or more of the report rules may also process report results generated from another one of the report rules. Further, one or more of the report rules may also retrieve error events that were previously filtered out. The report results 308 generated by the one or more report rules may be displayed to the user. The report results may provide various indications to the user regarding the report results. For example, the report result may provide text or graphics indicative of the result as well as one or more icons or other user interface elements for interacting with the displayed result reports.

Figure 4:
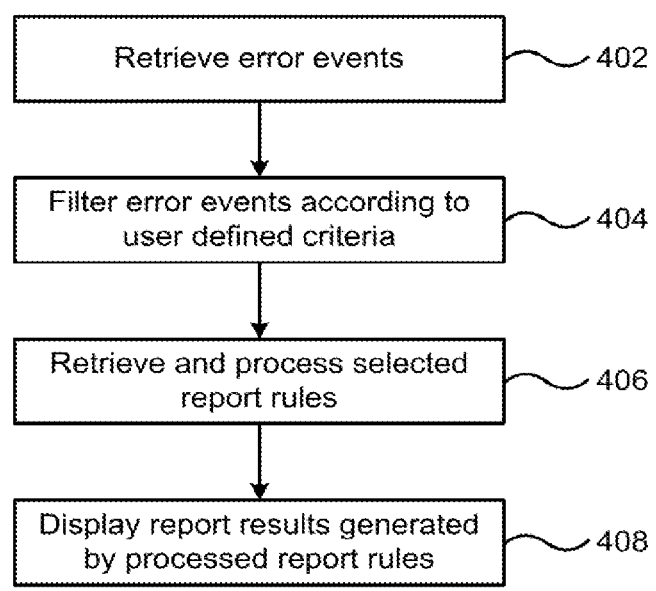
FIG. 4 depicts a method of generating a result report

FIG. 4 depicts a method of generating a result report. It is assumed that a circuit has been processed by circuit validating functionality and a plurality of error events have been produced as a result of the validation process. The error events are retrieved (402) and the error events filtered according to a user defined criteria (404). One or more report results are selected and retrieved from a database. The selected report rules that are retrieved are processed (406). The processing of the report rules may generate one or more result reports, which are displayed to the user (408).

The systems and methods described above provide the ability to validate a circuit definition and generate a result report based on the error events of tests. The system and methods described herein have been described with reference to various examples. It will be appreciated that components from the various examples may be combined together, or components of the examples removed or modified. As described the system may be implemented in one or more hardware components including a processing unit and a memory unit that are configured to provide the functionality as described herein. Furthermore, a computer readable memory, such as for example electronic memory devices, magnetic memory devices and/or optical memory devices, may store computer readable instructions for configuring one or more hardware components to provide the functionality described herein.

Embodiments within the scope of the present disclosure can be implemented in digital electronic circuitry, or in computer hardware, firmware, software configured hardware, or in combinations thereof. Instructions, possibly including program code, for configuring a computing system within the scope of the present disclosure can be stored on a computer program product tangibly embodied in a machine-readable non-transitory storage media. Such computer-readable non-transitory storage media may be any available non-transitory media, which is accessible by a general-purpose or special-purpose computer system. Examples of computer-readable storage media may include physical storage media such as RAM, ROM, EPROM, CD-ROM or other optical disk storage, magnetic disk storage or other magnetic storage devices, or any other media which can be used to carry or store desired program code means in the form of computer-executable instructions, computer-readable instructions, or data structures and which may be accessed by a general-purpose or special-purpose computer system.

Various specific details have been described above. While certain features or functionality may be described in particular detail with regard to one device or component, it will be appreciated that the functionality or features may be applied to other devices or components. While systems have been described Further, although various embodiments of the devices, equipment, functionality, etc. are described herein, the description is intended to provide an understanding of the systems, methods and devices and as such certain aspects may not be described, or not described in as much detail as other aspects. The described systems, methods and devices are not the sole possible implementations, and the various descriptions systems, methods and devices herein will enable one of ordinary skill in the art to apply the teachings to other equivalent implementations without exercising any inventive ingenuity.

What is claimed is:

1. A system comprising:
a memory for storing instructions; and
a computing system including one or more processing devices, the one or more processing devices, in response to executing the instructions, configured to:
validate a test circuit, which identifies error events indicative of problems associated with the test circuit;
filter the error events to identify a subset of the error events based on a filtering criteria;
select one or more report rules to retrieve from a report rules database storing a plurality of the report rules, wherein the selected report rules, when processed by the computing system, are configured to generate one or more report messages from the subset of the error events;
use the selected report rules retrieved from the report rules database to process the subset of the error events, which generates the one or more report messages; and
generate an error report using the one or more report messages generated by processing the subset of the error events using the selected report rules.

2. The system of claim 1, further comprising a display, wherein the instructions, when executed, further configure the one or more processing devices to present the generated error report to a user on the display.

3. The system of claim 1, wherein each of the error events comprises one or more of:
information describing the error associated with the error event;
a test identifier of a test that generated the error event;
a version number of the circuit the error event was generated for;
a revision number of the circuit the error event was generated for;
a date the test that generated the error event was run; and
a time the test that generated the error event was run.

4. The system of claim 3, wherein the filtering criteria corresponds to one or more of:
the test identifier associated with the error event;
the version number associated with the error event;
the revision number associated with the error event;
the date associated with the error event;
the time associated with the error event;
a severity associated with the error event;
a location within the circuit of the error associated with the error event; and
components connected to a portion of the circuit associated with the error event.

5. The system of claim 1, wherein the filtering of the error events to identify the subset of the error events is a coarse grain filtering of error events.

6. The system of claim 1, wherein the one or more report rules selected from the error report are retrieved from a plurality of pre-existing report rules.

7. The system of claim 6, wherein the one or more report rules are selected based on user input or a user selected report template.

8. The system of claim 1, wherein each of the one or more report rules specify the processing utilized to generate a particular report message.

9. The system of claim 1, wherein at least one of the one or more report rules generates the one or more report messages based on processing of at least one of the subset of the error events and one or more of:

error events stored in an error event database;
one or more report messages generated by report rules; and
a previous generation of reports.

10. The system of claim 1, wherein at least one of the one or more report rules adds one or more additional report rules for processing or removes one or more report rules from processing.

11. A method comprising:
validating a test circuit, which identifies error events indicative of problems associated with the test circuit;
filtering the error events to identify a subset of the error events based on a filtering criteria;
selecting one or more report rules to retrieve from a report rules database storing a plurality of the report rules, wherein the selected report rules, when processed by the computing system, are configured to generate one or more report messages from the subset of the error events;
using the selected report rules retrieved from the report rules database to process the subset of the error events, which generates the one or more report messages; and
generating an error report using the one or more report messages generated by processing the subset of the error events using the selected report rules.

12. The method of claim 11, further comprising displaying the generated error report on a display.

13. The method of claim 11, wherein each of the error events comprises one or more of:
information describing the error associated with the error event;
a test identifier of a test that generated the error event;
a version number of the circuit the error event was generated for;
a revision number of the circuit the error event was generated for;
a date the test that generated the error event was run; and
a time the test that generated the error event was run.

14. The method of claim 13, wherein the filtering criteria corresponds to one or more of:
the test identifier associated with the error event;
the version number associated with the error event;
the revision number associated with the error event;
the date associated with the error event;
the time associated with the error event; a severity associated with the error event;
a location within the circuit of the error associated with the error event; and
components connected to a portion of the circuit associated with the error event.

15. The method of claim 11, wherein the filtering of the error events to identify the subset of the error events is a coarse grain filtering of error events.

16. The method of claim 11, wherein the one or more report rules selected from the error report are retrieved from a plurality of pre-existing report rules.

17. The method of claim 16, wherein the one or more report rules are selected based on user input or a user selected report template.

18. The method of claim 11, wherein each of the one or more report rules specify the processing utilized to generate a particular report message.

19. The method of claim 11, wherein at least one of the one or more report rules generates the one or more report messages based on processing of at least one of the subset of the error events and one or more of:
error events stored in the error event database;
one or more report messages generated by report rules; and
a user's previous generation of reports.

20. The method of claim 11, wherein at least one of the one or more report rules adds one or more additional report rules for processing or removes one or more report rules from processing.

21. A non-transitory computer-readable medium storing a computer program product comprising instructions configured to cause one or more processing devices to perform operations comprising:
validating a test circuit, which identifies error events indicative of problems associated with the test circuit;
filtering the error events to identify a subset of the error events based on a filtering criteria;
selecting one or more report rules to retrieve from a report rules database storing a plurality of the report rules, wherein the selected report rules, when processed by the computing system, are configured to generate one or more report messages from the subset of the error events;
using the selected report rules retrieved from the report rules database to process the subset of the error events, which generates the one or more report messages; and
generating an error report using the one or more report messages generated by processing the subset of the error events using the selected report rules.

* * * * *